US012812892B2

(12) United States Patent
Nguyen et al.

(10) Patent No.: US 12,812,892 B2
(45) Date of Patent: Nov. 24, 2026

(54) SEMICONDUCTOR DEVICE INCLUDING TWO-DIMENSIONAL MATERIAL

(71) Applicant: Samsung Electronics Co., Ltd., Suwon-si (KR)

(72) Inventors: Van Luan Nguyen, Suwon-si (KR); Hyeonjin Shin, Suwon-si (KR); Minsu Seol, Seoul (KR); Yunseong Lee, Suwon-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 414 days.

(21) Appl. No.: 18/510,063

(22) Filed: Nov. 15, 2023

(65) Prior Publication Data

US 2024/0162337 A1 May 16, 2024

(30) Foreign Application Priority Data

Nov. 16, 2022 (KR) ........................ 10-2022-0153982
Oct. 5, 2023 (KR) ........................ 10-2023-0132514

(51) Int. Cl.

*H10D 30/47* (2025.01)
*H10D 64/23* (2025.01)
*H10D 64/27* (2025.01)

(52) U.S. Cl.

CPC ........... *H10D 30/47* (2025.01); *H10D 64/257* (2025.01); *H10D 64/514* (2025.01)

(58) Field of Classification Search

CPC .... H10D 30/47; H10D 64/257; H10D 64/514; H10D 30/611; H10D 64/685; H10D 62/80; H10B 61/22; H10B 63/30
See application file for complete search history.

(56) References Cited

U.S. PATENT DOCUMENTS

| | | | | |
|---|---|---|---|---|
| 2005/0053524 | A1* | 3/2005 | Keersmaecker | G01N 27/4145 422/98 |
| 2009/0101892 | A1* | 4/2009 | Dimitrakopoulos | H10K 71/191 257/E21.52 |
| 2017/0346010 | A1* | 11/2017 | Chen | H10K 71/18 |
| 2018/0129043 | A1* | 5/2018 | Kim | H10F 77/244 |
| 2019/0027623 | A1 | 1/2019 | Najmaei et al. | |
| 2019/0074180 | A1 | 3/2019 | Park et al. | |

FOREIGN PATENT DOCUMENTS

| | | | |
|---|---|---|---|
| CN | 106531613 | A | 3/2017 |
| KR | 20180022160 | A | 3/2018 |
| KR | 20220060233 | A | 5/2022 |

* cited by examiner

*Primary Examiner* — Jonathan Han

(74) *Attorney, Agent, or Firm* — Harness, Dickey & Pierce, P.L.C.

(57) ABSTRACT

A semiconductor device including a two-dimensional material is provided. The semiconductor device may include a two-dimensional material layer having semiconductor properties, a self-assembled monolayer in which self-assembled molecules are packed side-by-side, the self-assembled monolayer being arranged on the two-dimensional material layer, and an oxide layer arranged on the self-assembled monolayer.

18 Claims, 16 Drawing Sheets

SEMICONDUCTOR DEVICE INCLUDING TWO-DIMENSIONAL MATERIAL

CROSS-REFERENCE TO RELATED APPLICATIONS

This application is based on and claims priority under 35 U.S.C. § 119 to Korean Patent Application No. 10-2022-0153982, filed on Nov. 16, 2022 and Korean Patent Application No. 10-2023-0132514, filed on Oct. 5, 2023, in the Korean Intellectual Property Office, the disclosures of each of which are incorporated by reference herein in their entireties.

BACKGROUND

1. Field

The disclosure relates to a semiconductor device including a two-dimensional material and an apparatus including the same.

2. Description of the Related Art

Silicon is generally used for channel layers of transistors. When an electrode is to be formed on silicon, contact resistance may be lowered by over-doping an area in the silicon close to a source electrode and a drain electrode and then forming the electrode. However, because silicon cannot be manufactured to be thin while maintaining crystallinity, there are limits to scaling.

Therefore, in order to continue scaling semiconductor devices, research has been conducted to use atomic layer-thin and crystalline two-dimensional materials for channel layers, which unlike silicon, may still exhibit semiconductivity even when manufacture to be thin.

SUMMARY

Embodiments provide a structure capable of forming a uniform oxide layer on a two-dimensional material layer having semiconductor properties.

Embodiments provide a structure capable of forming an oxide layer having improved electrical properties on a two-dimensional material layer having semiconductor properties.

Additional aspects will be set forth in part in the description which follows and, in part, will be apparent from the description, or may be learned by practice of the presented embodiments of the disclosure.

According to an embodiment, a semiconductor device includes a channel layer including a two-dimensional material layer, a source electrode and a drain electrode spaced apart from each other on the channel layer, a gate electrode on the channel layer, a gate dielectric layer between the channel layer and the gate electrode, and a self-assembled monolayer between the channel layer and the gate dielectric, the self-assembled monolayer including self-assembled molecules packed side-by-side.

In addition, each of the self-assembled molecules may include an end group covalently bonded with the two-dimensional material layer.

In addition, each of the self-assembled molecules may include an end group with an oxygen bonded with a non-metal included in the two-dimensional material layer.

In addition, each of the self-assembled molecules may include an end group, and the end group may include at least one of an alkoxy, a halide, an alkyl group, and an alkenyl group.

In addition, each of the self-assembled molecules may include a head group covalently bonded with the gate dielectric layer.

In addition, each of the self-assembled molecules may include a head group with a non-metal bonded with oxygen included in the gate dielectric layer.

In addition, each of the self-assembled molecules may include a head group, and the head group include a polar species.

In addition, each of the self-assembled molecules may include a head group, and the head group may include at least one of a thiol group (—SH), an amino group (—$NH_2$), and a hydroxyl group (—OH).

In addition, an interfacial energy of the self-assembled monolayer may be higher than an interfacial energy of the two-dimensional material layer.

In addition, a water contact angle of the self-assembled monolayer may be less than a water contact angle of the two-dimensional material layer.

In addition, a water contact angle of the self-assembled monolayer may be less than or equal to 75 degrees.

In addition, a thickness of the gate dielectric layer may be greater than or equal to a thickness of the self-assembled monolayer.

In addition, a thickness of the gate dielectric layer may be at least 1 nm and 20 nm or less.

In addition, the gate dielectric layer may be non-porous.

In addition, an equivalent oxide thickness (EOT) of the gate dielectric layer may be greater than or equal to 0.9 nm.

In addition, the gate dielectric layer may include at least one of hafnium (Hf), silicon (Si), aluminum (Al), zirconium (Zr), yttrium (Y), lanthanum (La), gadolinium (Gd), and strontium (Sr).

In addition, the two-dimensional material layer may include a transition metal chalcogenide (TMC).

In addition, the TMC may include at least one of molybdenum (Mo), tungsten (W), niobium (Nb), vanadium (V), tantalum (Ta), titanium (Ti), zirconium (Zr), hafnium (Hf), technetium (Tc), and rhenium (Re), and a chalcogen element selected from sulfur (S), selenium (Se), and tellurium (Te).

In addition, at least one of the source electrode and the drain electrode may include an oxide having conductive properties.

In addition, the self-assembled monolayer may be further included between the two-dimensional material layer and at least one of the source electrode and the drain electrode.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
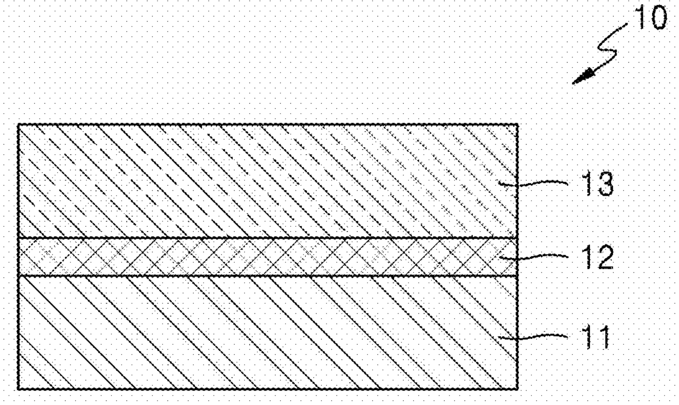
FIG. 1 is a diagram of a thin-film structure according to at least one embodiment.

Reference will now be made in detail to embodiments, examples of which are illustrated in the accompanying drawings. Hereafter and in the following drawings, like reference numerals refer to like elements, and the sizes of elements in the drawings may be exaggerated for clarity and convenience of description. In addition, embodiments described below are merely illustrative, and various modifications may be made from these embodiments. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, when a component is referred to as being "on", "above", or "over" another component, it can be directly on or under or in the left or right of the other component in contact with the other component, or indirectly above or under or in the left or right of the other component without contact with the other component. Additionally, spatially relative terms, such as "beneath," "below," "lower," "under," "above," "upper," and the like, may be used herein for ease of explanation to describe one element or feature's relationship to another element or feature as illustrated in the figures. It will be understood that the spatially relative terms are intended to encompass different orientations of the device in use or in operation, in addition to the orientation depicted in the figures. For example, device may be otherwise oriented, for example, rotated 90 degrees or at other orientations, and the spatially relative descriptors used herein should be interpreted accordingly. The singular forms "a," "an," and "the" as used herein are intended to include the plural forms as well unless the context clearly indicates otherwise. Also, it will be understood that when a portion is referred to as "including" another component, it may not exclude the other component but may further include the other component unless otherwise described.

The use of the term "the" and similar referential terms may refer to both the singular and the plural expressions. Unless an order is specifically stated or stated to the contrary, operations constituting a method may be performed in any appropriate order and are not necessarily limited to the specified order.

In addition, functional blocks, including those described with the term ". . . or "er" or the term "module" used herein refers to a unit is configured to process and/or perform at least one function of operation, which may be implemented as (and/or in) processing circuitry such as hardware or software, or as a combination of hardware and software. For example, the processing circuitry more specifically may include (and/or be included in), but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

Connections of lines or connection members between components shown in the drawings illustratively represent functional connections and/or physical or circuit connections, and in an actual apparatus, they may appear as various types of alternative or additional functional, physical, or circuit connections.

The terms such as first and second may be used to describe various components, but the components should not be limited by these terms. Terms are used only to distinguish one component from another.

The use of all examples or illustrative terms is simply for explaining the technical idea in detail, and the scope of the disclosure is not limited by the examples or illustrative terms unless limited by the claims. Additionally, when the terms "about" or "substantially" are used in this specification in connection with a numerical value, it is intended that the associated numerical value includes a manufacturing tolerance (e.g., ±10%) around the stated numerical value. Further, regardless of whether numerical values are modified as "about" or "substantially," it will be understood that these values should be construed as including a manufacturing or operational tolerance (e.g., ±10%) around the stated numerical values. When referring to "C to D", this means C inclusive to D inclusive unless otherwise specified.

FIG. 1 is a diagram of a thin-film structure 10 according to at least one embodiment. Referring to FIG. 1, the thin-film structure 10 includes a two-dimensional material layer 11 having semiconductor properties, a self-assembled monolayer 12 arranged on the two-dimensional material layer 11, and an oxide layer 13 arranged on the self-assembled monolayer 12.

The two-dimensional material layer 11 may include a material having a two-dimensional crystal structure. A two-dimensional material may have a monolayer or multilayer structure. Each layer constituting the two-dimensional material may have a thickness at an atomic level (e.g., between 1 to 3 atoms). In at least some embodiments of the multilayer structure, each of the layers may adhere to an adjacent layer through a weak intermolecular force, such as a van der Waals force. The two-dimensional (2D) material may include, for example, at least one of graphene, phosphorous black, a transition metal chalcogenide (TMC), and/or the like.

The TMC may include, for example, a transition metal (including, e.g., at least one of molybdenum (Mo), tungsten (W), niobium (Nb), vanadium (V), tantalum (Ta), titanium (Ti), zirconium (Zr), hafnium (Hf), technetium (Tc), and rhenium (Re)), and a chalcogen element (including, e.g., at least one of sulfur (S), selenium (Se), and tellurium (Te)). The TMC may be a transition metal dichalcogenide (TMD) and may be expressed, for example, as $MX_2$, where M represents a transition metal and X represents a chalcogen element. For example, M may be Mo, W, Nb, V, Ta, Ti, Zr, Hf, Tc, or Re, and X may be S, Se, or Te. Accordingly, for example, the TMD may include at least one of $MoS_2$, $MoSe_2$, $MoTe_2$, $WS_2$, $WSe_2$, $WTe_2$, $ZrS_2$, $ZrSe_2$, $HfS_2$, $HfSe_2$, $NbSe_2$, $ReSe_2$, or the like. Alternatively, the TMC may not be expressed as $MX_2$. In these cases, for example, the TMC may include CuS that is a compound of a transition metal Cu and a chalcogen element S. In addition, the 2D material may be 2D semiconductor material including a chalcogenide based material including a non-transition metal. For example, the non-transition metal may include at least one of gallium (Ga), indium (In), tin (Sn), germanium (Ge), lead (Pb), or the like. In these cases case, the 2D material may include a compound of a non-transition metal, such as Ga, In, Sn, Ge, or Pb, and a chalcogen element, such as S, Se, or Te, such as $SnSe_2$, GaS, GaSe, GaTe, GeSe, $In_2Se_3$, $InSnS_2$, or the like.

As described above, the 2D material may include one metal element among Mo, W, Nb, V, Ta, Ti, Zr, Hf, Tc, Re, Cu, Ga, In, Sn, Ge, and Pb and one chalcogen element among S, Se, and Te. However, the materials mentioned above are merely examples, and other materials may be used as the 2D material.

A thickness of the two-dimensional material layer 11 may be very thin. e.g., 3 nm or less. For example, the two-dimensional material layer 11 may include a single layer. Therefore, scaling of the thin-film structure 10 may be reduced by applying the two-dimensional material layer 11 to the thin-film structure 10.

The self-assembled monolayer 12 may be arranged on the two-dimensional material layer 11. The self-assembled monolayer 12 may be formed on the two-dimensional material layer 11 through surface treatment.

The composition of the self-assembled monolayer may be selected such that the interfacial energy of the self-assembled monolayer 12 is different from interfacial energy of the two-dimensional material layer 11. For example, the interfacial energy of the self-assembled monolayer 12 may be higher than the interfacial energy of the two-dimensional material layer 11.

As such, a water contact angle of the self-assembled monolayer 12 may be different from a water contact angle of the two-dimensional material layer 11. For example, the water contact angle of the self-assembled monolayer 12 may be less than the water contact angle of the two-dimensional material layer 11. In at least some embodiments, the water contact angle of the self-assembled monolayer 12 may be less than or equal to 75 degrees.

The self-assembled monolayer 12 may be a layer in which self-assembled molecules are packed side-by-side. The self-assembled molecules may also be packed densely and at regular intervals, and the self-assembled monolayer 12 may also have localized vacancy.

In at least some embodiments, each of the self-assembled molecules may include an end group, a head group, and a backbone between the end group and the head group.

The end group may chemisorb or chemically bond with the two-dimensional material layer 11. For example, in at least some embodiments, the end group may covalently bond with the two-dimensional material layer 11. For example, oxygen included in the end group may bond with a non-metal included in the two-dimensional material layer 11.

The end group may include, for example, a functional group configured to bond with the two-dimensional material layer 11. The end group may include, for example, an alkoxy or a halide. Alternatively, the end group may include a nonpolar alkyl group (e.g., methyl group ($—CH_3$) or an ethyl group ($—C_2H_5$)) or an alkenyl group (e.g., an ethylenyl group ($—CH{=}CH_2$)). For example, in a case where the end group of the self-assembled monolayer 12 includes $—Si(OCH_3)$, when the two-dimensional material layer 11 and the self-assembled monolayer 12 bond with each other, the methyl group ($—CH_3$) may be separated, and the O (oxygen) of the end group may covalently bond with the two-dimensional material layer 11. For example, in the case wherein the two-dimensional material layer 11 includes TMC, the end ground may covalently bond with the non-metal (e.g., the chalcogenide) of the TMC. Alternatively, e.g., in the case wherein the two-dimensional material layer 11 includes graphene, the end group may be selected based on a property to chemisorb to the graphene using, e.g., pi-bonds exposed from the graphene's upper surface.

The head group may chemisorb or chemically bond with the oxide layer 13. For example, in at least some embodiments, the head group may covalently bond with the oxide layer 13. For example, a non-metal included in the head group may bond with oxygen included in the oxide layer 13.

The head group may include, for example, a functional group that makes the interfacial energy of the self-assembled monolayer 12 higher than the interfacial energy of the two-dimensional material layer 11. In at least some embodiments, the head group may include a polar species such as a thiol group ($—SH$), an amino group ($—NH_2$), and a hydroxyl group ($—OH$). However, the examples are not limited thereto. More specifically, the functional group of the head group may include other examples of the functional group so long as the functional group makes the interfacial energy of the self-assembled monolayer 12 higher than the interfacial energy of the two-dimensional material layer 11.

The head group may enable the chemisorb or chemically bond with the oxide layer 13. For example, the head group may covalently bond with the oxide layer 13. In at least some embodiments, a non-metal included in the head group may bond with the oxygen included in the oxide layer 13. For example, the thiol group (—SH) of the head group may bond with the oxygen of the oxide layer 13.

The backbone may connect the end group and the head group to each other. The backbone may include heteroatoms, but the examples are not limited thereto. For example, the backbone may include an aliphatic carbon chain or aromatic carbon. In some embodiments, a hydrocarbon forming the backbone may be a chain hydrocarbon having a main chain having 3 to 1000 carbon atoms. The hydrocarbon may further include a side chain. In at least some embodiments a silane group may form the backbone, such the backbone may have a polysilyl form, such as —$(SiH_2)n$—, where silicon atoms are connected in a chain shape, and n may be an integer from 3 to 500.

In some embodiments, the end group of the self-assembled monolayer 12 may be terminated with the same type of atomic group as the backbone. For example, when the backbone is a hydrocarbon, the end group may be a methyl group (—$CH_3$) and/or, when the backbone is a polysilyl group, the end group may be a silane group (—$SH_3$).

The oxide layer 13 may include a paraelectric material. The oxide layer 13 may include, for example, at least one of silicon oxide, metal oxide having a high dielectric constant, or the like. The oxide layer 13 may include, for example, at least one oxide of Hf, silicon (Si), aluminum (Al), Zr, yttrium (Y), lanthanum (La), gadolinium (Gd), and strontium (Sr). However, the examples are not limited thereto.

In some embodiments, the oxide layer 13 may include a ferroelectric material. The oxide layer 13 may include, for example, at least one oxide selected from Hf, Si, Al, Zr, Y, La, Gd, and Sr. However, the examples are not limited thereto. Also, the oxide layer 13 may further include a dopant as necessary. For example, the dopant may be provided to induce a ferroelectric phase in the ferroelectric material. In at least some embodiments, the dopant may include, for example, at least one selected from Si, Al, Zr, Y, La, Gd, Sr, and Hf such that the dopant is different from the main component of the oxide. When the dopant is included in the oxide layer 13, the dopant may be doped at the same concentration overall, or may be doped at different concentrations according to the region. Also, the oxide layer 13 may be doped with different doping materials according to the region.

Alternatively, the oxide layer 13 may include a conductive material. The oxide layer 13 may include, for example, at least one oxide selected from In, Ti, and zinc (Zn).

Figure 2:
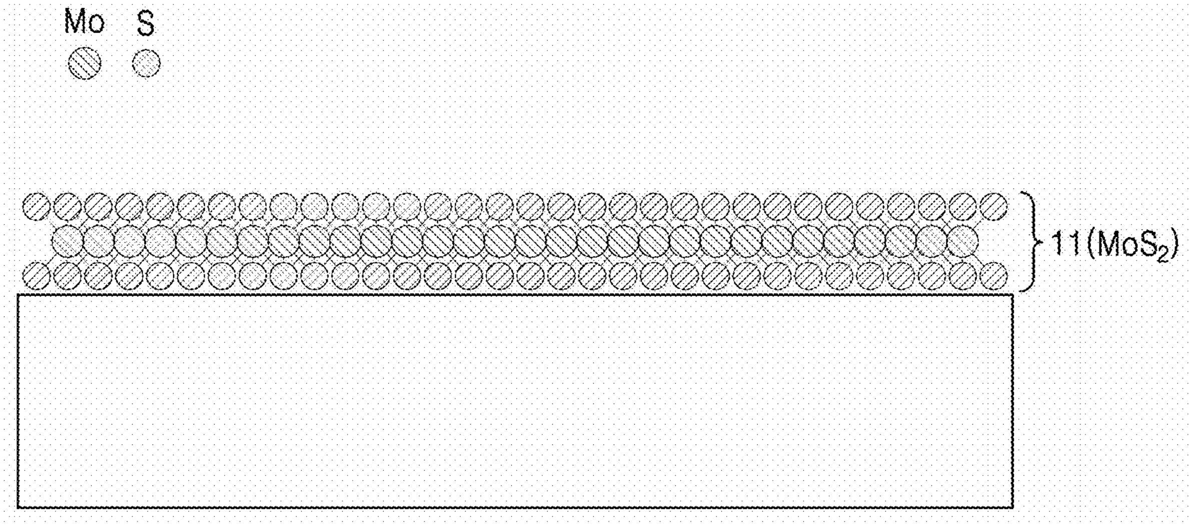
FIG. 2 is a schematic diagram of an atomic structure of a two-dimensional material layer on a substrate, according to at least one embodiment.

FIG. 2 is a schematic diagram of an atomic structure of a two-dimensional material layer on a substrate, according to at least one embodiment. As shown in FIG. 2, there are almost no dangling bonds on the surface of the two-dimensional material layer 11 including $MoS_2$. Therefore, deposition of a stable oxide layer on the two-dimensional material layer 11 may be difficult. More specifically, even though the oxide layer is deposited on the two-dimensional material layer 11, the oxide layer may be deposited through random nucleation defects and edges of the two-dimensional material layer 11. Therefore, the oxide layer formed directly on the two-dimensional material layer 11 may be porous.

Figure 3:
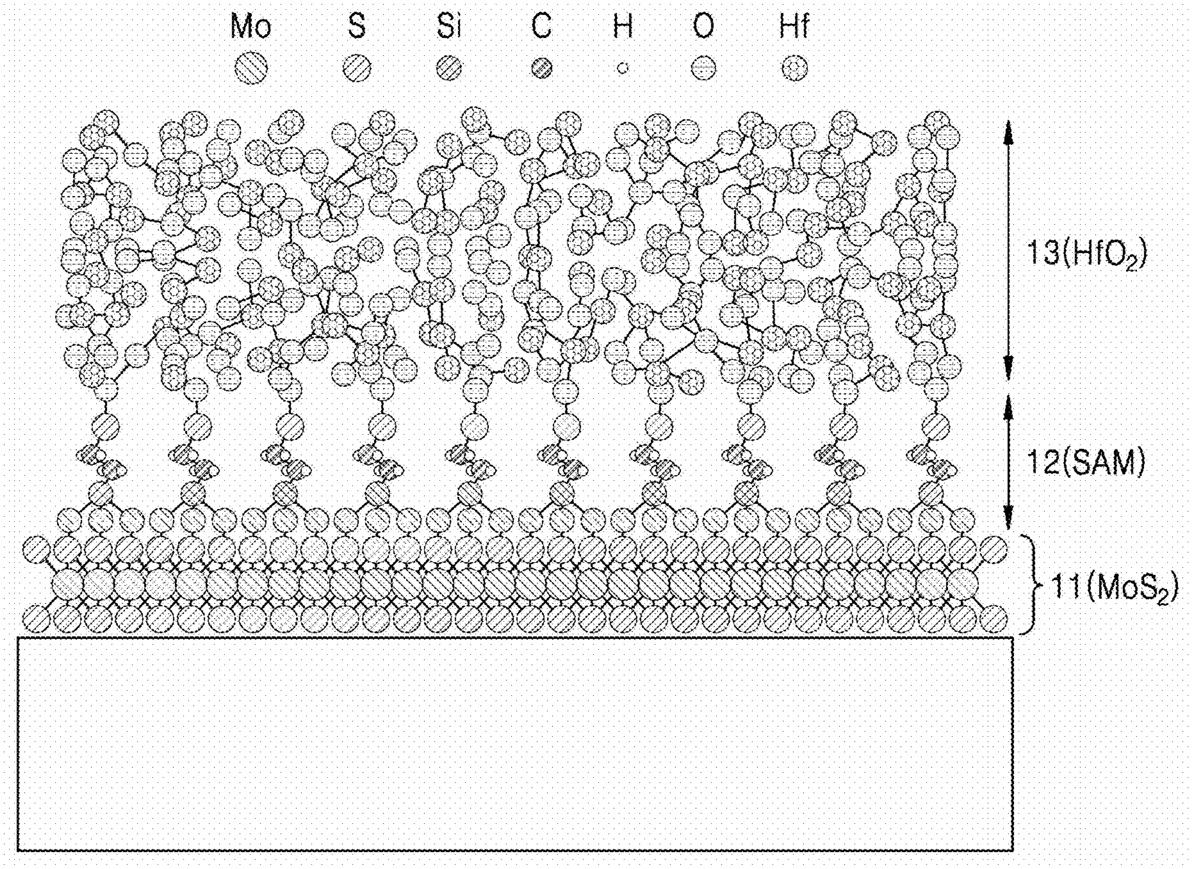
FIG. 3 is a schematic diagram of an atomic structure of a two-dimensional material layer, a self-assembled monolayer, and an oxide layer, on a substrate, according to at least one embodiment.

FIG. 3 is a schematic diagram of an atomic structure of a two-dimensional material layer, a self-assembled monolayer, and an oxide layer, on a substrate, according to at least one embodiment. As shown in FIG. 3, self-assembled molecules may be packed side-by-side on the surface of the two-dimensional material layer 11 to form the self-assembled monolayer 12. An end group of a self-assembled molecule included in the self-assembled monolayer 12 may covalently bond with the two-dimensional material layer 11. For example, in a case where the end group of the self-assembled molecule includes —$Si(OCH_3)_3HS$, when the self-assembled molecule bonds with the two-dimensional material layer 11, —$CH_3$ may be separated, and O (oxygen) of the end group may covalently bond with S of the two-dimensional material layer 11.

A head group of the self-assembled monolayer 12 may include a functional group whose interfacial energy of the self-assembled monolayer 12 is greater than interfacial energy of the two-dimensional material layer 11. For example, the head group of the self-assembled monolayer 12 may include a thiol group (—SH). The thiol group (—SH), which is a head group of the self-assembled molecule, may be aligned on the surface of the self-assembled monolayer 12.

The oxide layer 13 formed on the self-assembled monolayer 12 may bond with the head group of the self-assembled molecule. The oxide layer 13 may covalently bond with the head group of the self-assembled monolayer 12. For example, when the oxide layer 13 includes $HfO_2$, oxygen (—O) of the oxide layer 13 may covalently bond with the thiol group (—SH) of the head group.

Because self-assembled molecules of the self-assembled monolayer 12 are packed side-by-side, surface density of the self-assembled monolayer 12 (e.g., the packing density of the self-assembled molecules) may be less than surface density of the atoms of the two-dimensional material layer 11. However, this may be similar to defects being regularly arranged in the two-dimensional material layer 11 surface treated with the self-assembled monolayer 12. Therefore, the oxide layer 13 may be uniformly formed by bonding with head groups of the self-assembled molecules.

Figure 4:
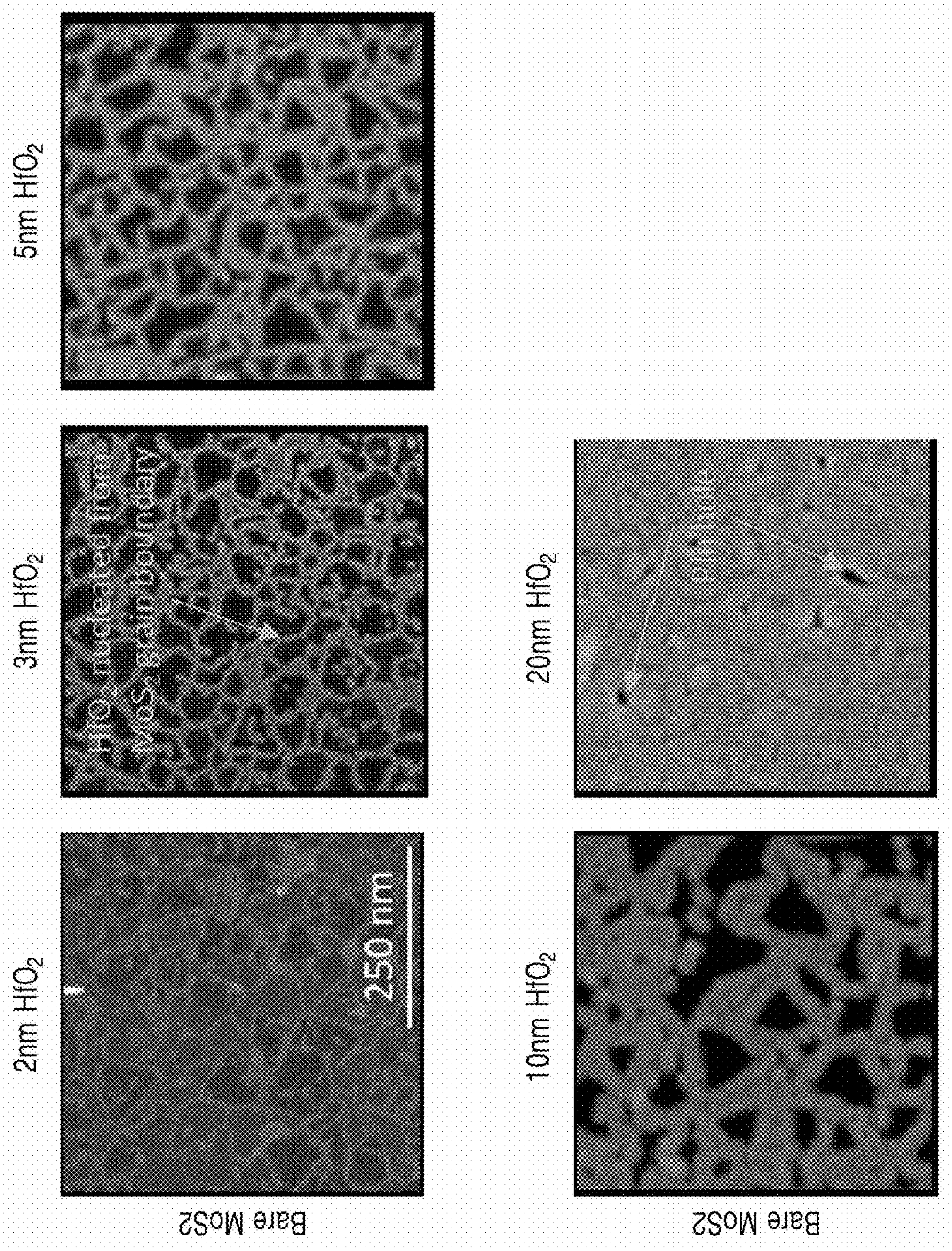
FIG. 4 is a comparative example showing results of growing an oxide layer including $HfO_2$ on a two-dimensional material layer including $MoS_2$.

FIG. 4 is a comparative example showing results of growing an oxide layer including $HfO_2$ directly on the two-dimensional material layer 11 including $MoS_2$. Referring to FIG. 4, it may be seen that an oxide layer having a thickness of about 2 nm is sparsely formed on the two-dimensional material layer 11. This is because oxide only grows in defects in the two-dimensional material layer 11. An oxide layer having a thickness of 20 nm may be formed, but holes are formed in the oxide layer. That is, it may be seen that a porous oxide layer is formed.

Figure 5:
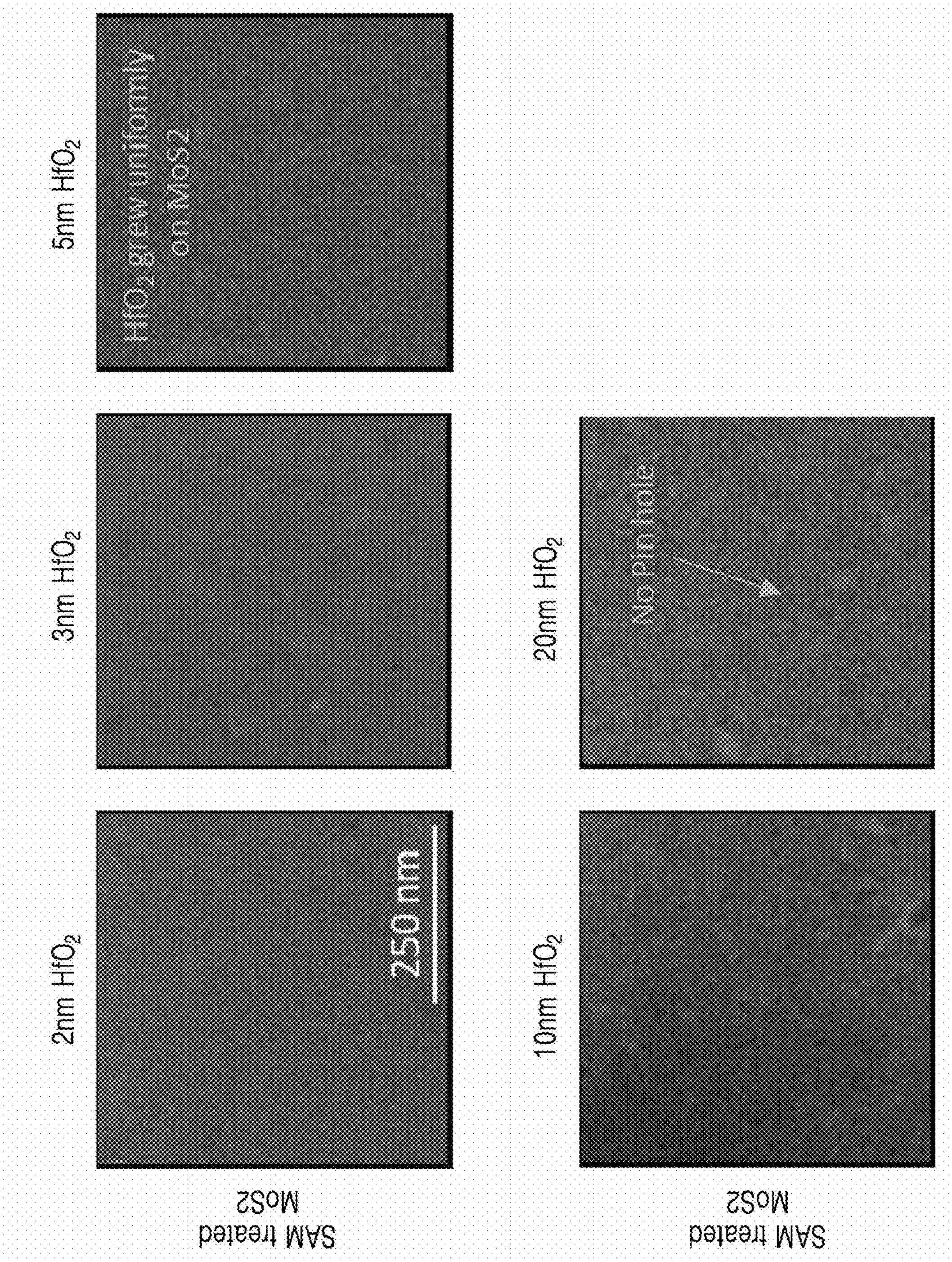
FIG. 5 is a diagram showing results of growing an oxide layer including $HfO_2$ on a two-dimensional material layer surface-treated with a self-assembled monolayer, according to at least one embodiment.

FIG. 5 is a diagram showing results of growing an oxide layer including $HfO_2$ on a two-dimensional material layer surface-treated with a self-assembled monolayer, according to at least one embodiment. According to at least one embodiment, an end group of the self-assembled monolayer 12 may include —$Si(OCH_3)$, and a head group thereof may include —SH. Referring to FIG. 5, it may be seen that the oxide layer 13 is uniformly formed even at a thin thickness of 2 nm to 20 nm. Also, no holes were found even at a thickness of 20 nm. That is, it may be identified that non-porous oxide layer 13 is formed on the two-dimensional material layer 11 surface-treated with the self-assembled monolayer 12.

In addition, transistors, etc., require a uniform oxide layer to reduce leakage current from a gate electrode to a channel layer 110. To form a uniform oxide layer, the two-dimensional material layer may be surface treated with ozone, mild-plasma, and electron beam irradiation. However, the aforementioned surface treatment may damage the two-dimensional material and requires expensive equipment.

According to at least one embodiment, in the thin-film structure 10, the self-assembled monolayer 12 may be formed on the two-dimensional material layer 11. Because a component of the self-assembled monolayer 12 chemically bonds with a component of the two-dimensional material layer 11, the two-dimensional material layer 11 may be more resilient compared to the comparative example, thereby mitigating and/or preventing damage. For example, a sulfur component of the two-dimensional material layer 11 may bond with an oxygen component of the self-assembled monolayer 12.

Because the head group included in the self-assembled monolayer 12 has high interfacial energy, the oxide layer 13 is easily adsorbed to the self-assembled monolayer 12 such that the oxide layer 13 may be easily formed. The thickness of the oxide layer described above may be about 1 nm to about 20 nm and may be non-porous.

Figure 6:
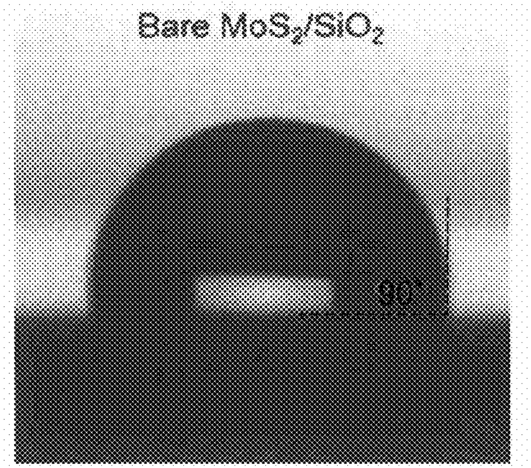
FIG. 6 is a comparative example showing results of measuring a water contact angle of a two-dimensional material layer including $MoS_2$ on a substrate.

FIG. 6 is a comparative example showing results of measuring a water contact angle of the two-dimensional material layer 11 including $MoS_2$ on a substrate. As shown in FIG. 6, it may be seen that a water contact angle of the two-dimensional material layer 11 is as large as about 90 degrees.

Figure 7:
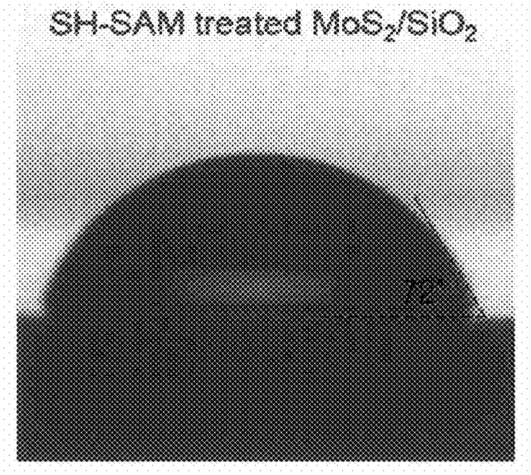
FIG. 7 is at least one embodiment showing results of measuring a water contact angle of a two-dimensional material layer surface-treated with a self-assembled monolayer on a substrate.

FIG. 7 is at least one embodiment showing results of measuring a water contact angle of a two-dimensional material layer surface-treated with a self-assembled monolayer on a substrate. In this case, the self-assembled monolayer includes self-assembled molecules whose end group includes —$Si(OCH_3)$ and head group includes —SH, and the two-dimensional material layer includes $MoS_2$.

As shown in FIG. 7, it may be seen that a water contact angle of the two-dimensional material layer surface-treated with the self-assembled monolayer was lowered to about 72 degrees. It may be expected that the water contact angle was lowered because interfacial energy of a head group included in the self-assembled monolayer is higher than interfacial energy of the two-dimensional material layer 11.

Figure 8:
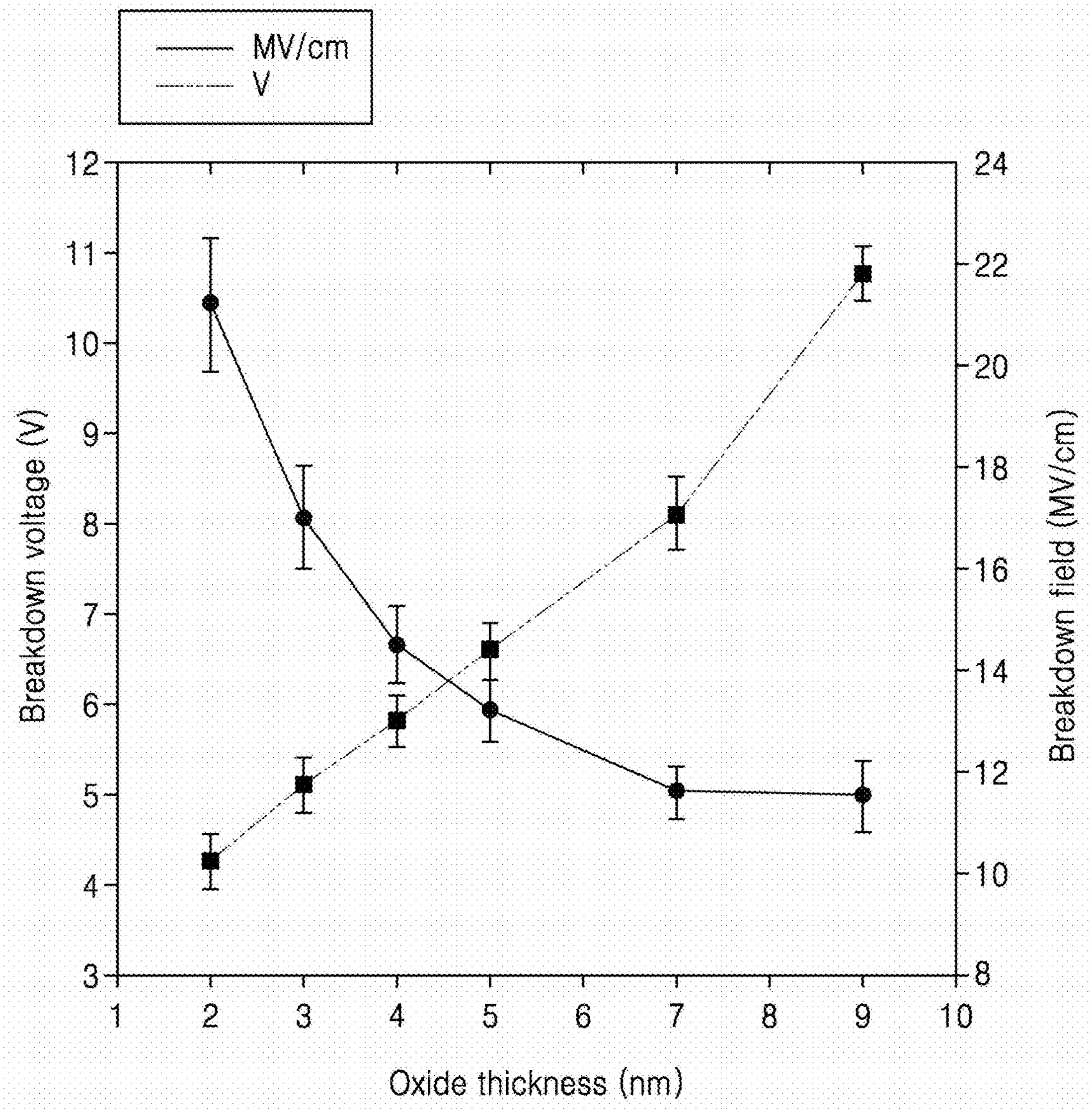
FIG. 8 is a diagram showing breakdown field properties of an oxide layer formed on a two-dimensional material layer surface-treated with a self-assembled monolayer, according to at least one embodiment.

FIG. 8 is a diagram showing breakdown field properties of an oxide layer formed on a two-dimensional material layer surface-treated with a self-assembled monolayer, according to at least one embodiment. In this case, the self-assembled monolayer includes self-assembled molecules whose end group includes —$Si(OCH_3)$ and head group includes —SH, and the two-dimensional material layer includes $MoS_2$. Referring to FIG. 8, it may be seen that a breakdown electric field is inversely proportional to the thickness of the oxide layer. Even when the thickness of the oxide layer is about 2 nm, the breakdown electric field is 22 MV/cm, and thus, it may be identified that the oxide layer has insulating properties.

Figure 9:
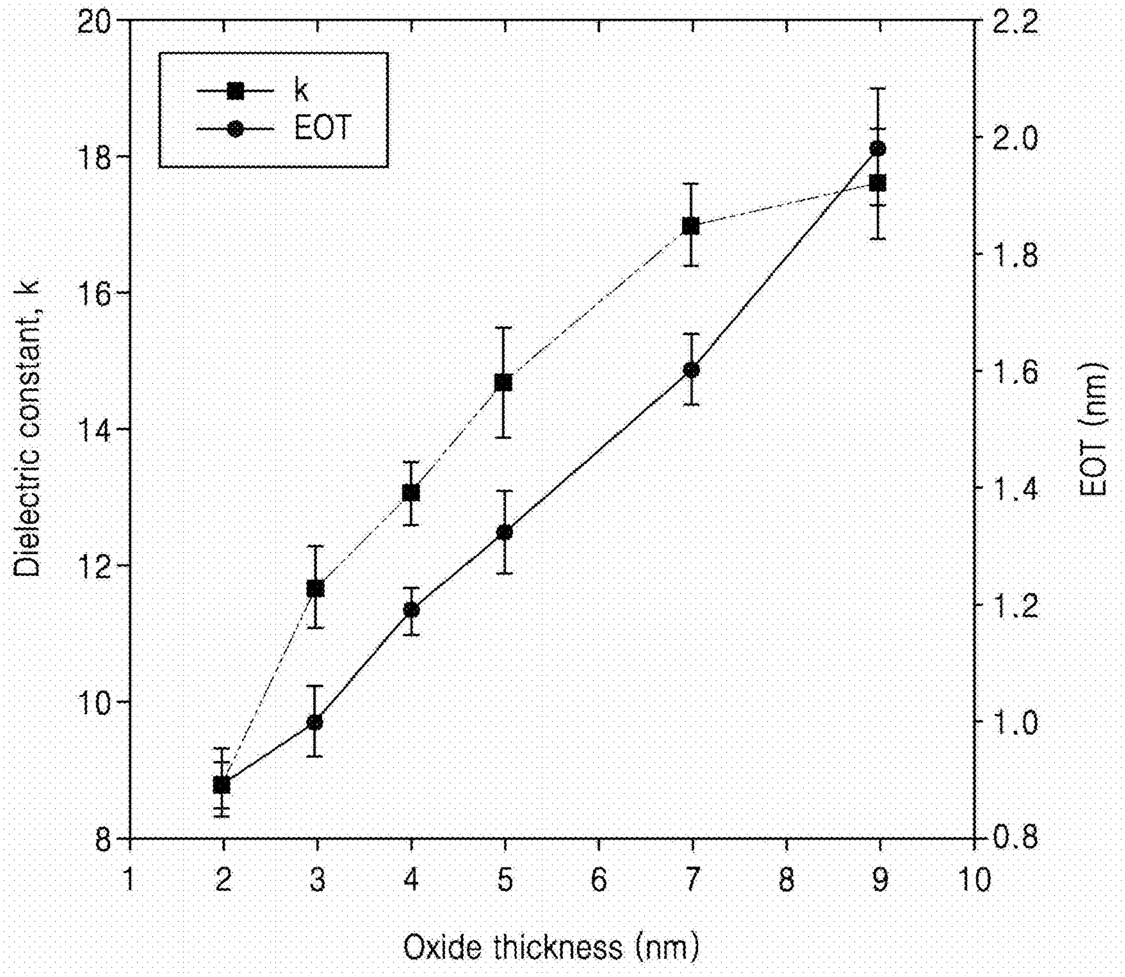
FIG. 9 is a diagram showing an equivalent oxide thickness (EOT) of an oxide layer formed on a two-dimensional material layer surface-treated with a self-assembled monolayer, according to at least one embodiment.

FIG. 9 is a diagram showing an equivalent oxide thickness (EOT) of an oxide layer formed on a two-dimensional material layer surface-treated with the self-assembled monolayer 12, according to at least one embodiment. In this case, the self-assembled monolayer includes self-assembled molecules whose end group includes —$Si(OCH_3)$ and head group includes —SH, and the two-dimensional material layer includes $MoS_2$.

Referring to FIG. 9, it may be identified that the EOT is proportional to the thickness of the oxide layer. A dielectric constant of the oxide layer may be adjusted by adjusting the thickness of the oxide layer. According to at least one embodiment, the oxide layer be formed such that the EOT of the oxide layer is greater than or equal to 0.9 nm.

According to at least one embodiment, the thin-film structure 10 may be a component of the semiconductor device. For example, when the semiconductor device is a transistor, the two-dimensional material layer 11 may be channel layer, and the oxide layer 13 may be a gate dielectric layer 130.

Figure 10:
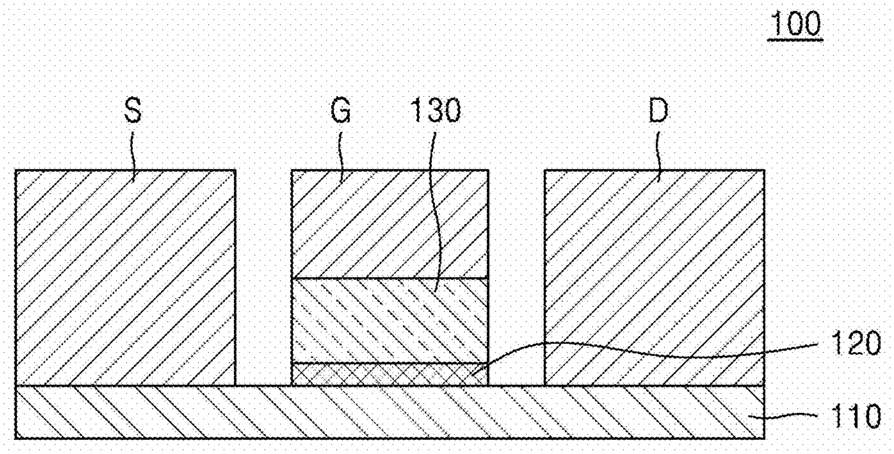
FIG. 10 is a diagram of a semiconductor device including a self-assembled monolayer, according to at least one embodiment.

FIG. 10 is a diagram of a semiconductor device 100 including a self-assembled monolayer, according to at least one embodiment. Referring to FIG. 10, the semiconductor device 100 may include a channel layer 110, a source electrode S and a drain electrode D, which are spaced apart from each other on the channel layer 110, a gate electrode G spaced apart from the channel layer 110, and a gate dielectric layer 130 between the channel layer 110 and the gate electrode G. The semiconductor device 100 may further include a self-assembled monolayer 120 between the channel layer 110 and the gate dielectric layer 130. The channel layer 110 may correspond to the two-dimensional material layer 11 described with reference to FIG. 1, and a detailed description thereof is omitted.

The source electrode S and the drain electrode D may be spaced apart from each other and arranged on the channel layer 110. In at least some embodiments, the source electrode S and the drain electrode D may be arranged on the same surface of the channel layer 110. The source electrode S and the drain electrode D may include an electrically conductive material such as a metal, a metal compound, and/or a metallically conductive material.

The gate electrode G may be between the source electrode S and the drain electrode D and may be arranged over the channel layer 110. In at least some embodiments, the gate electrode G, the source electrode S, and the drain electrode D may be arranged on the same surface of the channel layer 110. According to an example, the gate electrode G may include an electrically conductive material. For example, the gate electrode G may include a metal, a metal compound, and/or a metallically conductive material.

The gate dielectric layer 130 may be between the channel layer 110 and the gate electrode G to electrically disconnect the channel layer 110 and the gate electrode G from each other. The gate insulating layer 130 may include an insulating material. The gate dielectric layer 130 may include a paraelectric material, a ferroelectric material, and/or the like. As an example, the gate dielectric layer 130 may include oxide, and the gate dielectric layer 130 may be the oxide layer 13 having insulating properties described with reference to FIG. 1.

The semiconductor device 100 of FIG. 10 may further include the self-assembled monolayer 120 between the channel layer 110 and the gate dielectric layer 130. A width of the self-assembled monolayer 120 may be greater than or equal to a width of the gate dielectric layer 130. Interfacial energy of the self-assembled monolayer 120 may be greater than interfacial energy of the channel layer 110. Additionally, a water contact angle of the self-assembled monolayer 120 may be less than a water contact angle of the channel layer 110. For example, the water contact angle of the self-assembled monolayer 120 may be less than or equal to about 75 degrees.

The self-assembled monolayer 120 may be a layer in which self-assembled molecules are packed side-by-side. Each self-assembled molecule may include an end group, a head group, and a backbone therebetween. As an example, the self-assembled monolayer 120 may be the self-assembled monolayer 12 described with reference to FIG. 1.

For example, the end group may chemisorb or chemically bond with the channel layer 110. The end group may covalently bond with the channel layer 110. For example, oxygen included in the end group may bond with a nonmetal included in the channel layer 110.

The end group may bond with the channel layer 110. The end group may include, for example, alkoxy or a halide. Alternatively, the end group may include a nonpolar alkyl group (e.g., methyl group (—$CH_3$) or an ethyl group (—$C_2H_5$)) or an alkenyl group (e.g., an ethylenyl group (—CH═$CH_2$)). For example, in a case where the end group of the self-assembled monolayer 120 includes —$OCH_3$, when the channel layer 110 and the self-assembled monolayer 120 bond with each other, the methyl group (—$CH_3$) may be separated, and the oxygen of the end group may covalently bond with the non-metal of the channel layer 110.

The head group may chemisorb or chemically bond with the gate dielectric layer 130. The head group may covalently bond with the gate dielectric layer 130. For example, a non-metal included in the head group may bond with oxygen included in the gate dielectric layer 130.

The head group may include a functional group that makes the interfacial energy of the self-assembled monolayer 120 higher than the interfacial energy of the channel layer 110. The head group may include a polar species such as a thiol group (—SH), $NH_2$, and OH. However, the examples are not limited thereto. In at least some examples, the thiol group (—SH) of the head group may bond with the oxygen of gate dielectric layer 130.

A thickness of the self-assembled monolayer 120 may be less than or equal to a thickness of the gate dielectric layer 130. The thickness of the self-assembled monolayer 120 may be about 3 Å or more, about 10 Å or more, or about 50 Å or more. For example, the thickness of the gate dielectric layer 130 may be at least about 1 nm and about 20 nm or less. The gate dielectric layer 130 formed on the self-assembled monolayer 120 may be non-porous. In addition, the features of the self-assembled monolayer 12 described with reference to FIG. 1 may also apply to the self-assembled monolayer 120 of FIG. 10.

In FIG. 10, it has been described that the gate dielectric layer 130 is formed on the self-assembled monolayer 120, but is not limited thereto. In addition to the gate dielectric layer 130, the source electrode S and the drain electrode D may also be formed on the self-assembled monolayer 120.

Figure 11:
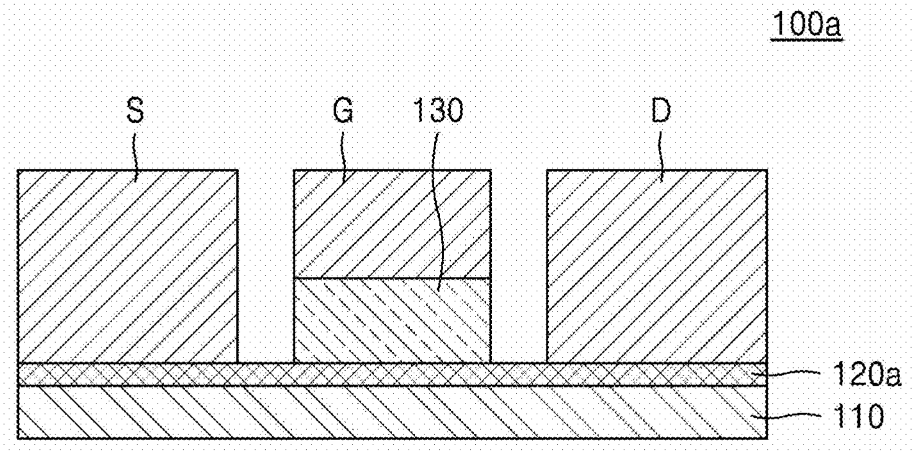
FIG. 11 is a diagram of a semiconductor device including a self-assembled monolayer, according to at least one embodiment.

FIG. 11 is a diagram of a semiconductor device 100*a* including a self-assembled monolayer, according to at least one embodiment. Comparing FIGS. 10 and 11, a self-assembled monolayer 120*a* of FIG. 11 may be arranged over the entire upper surface of a channel layer 110. The self-assembled monolayer 120*a* may overlap a source electrode S, a drain electrode D, and a gate electrode G in a thickness direction of the channel layer 110. The gate dielectric layer 130, the source electrode S, and the drain electrode D may be uniformly formed by the self-assembled monolayer 120*a*. The source electrode S and the drain electrode D may include metal oxide having conductive properties, but are not limited thereto.

Figure 12:
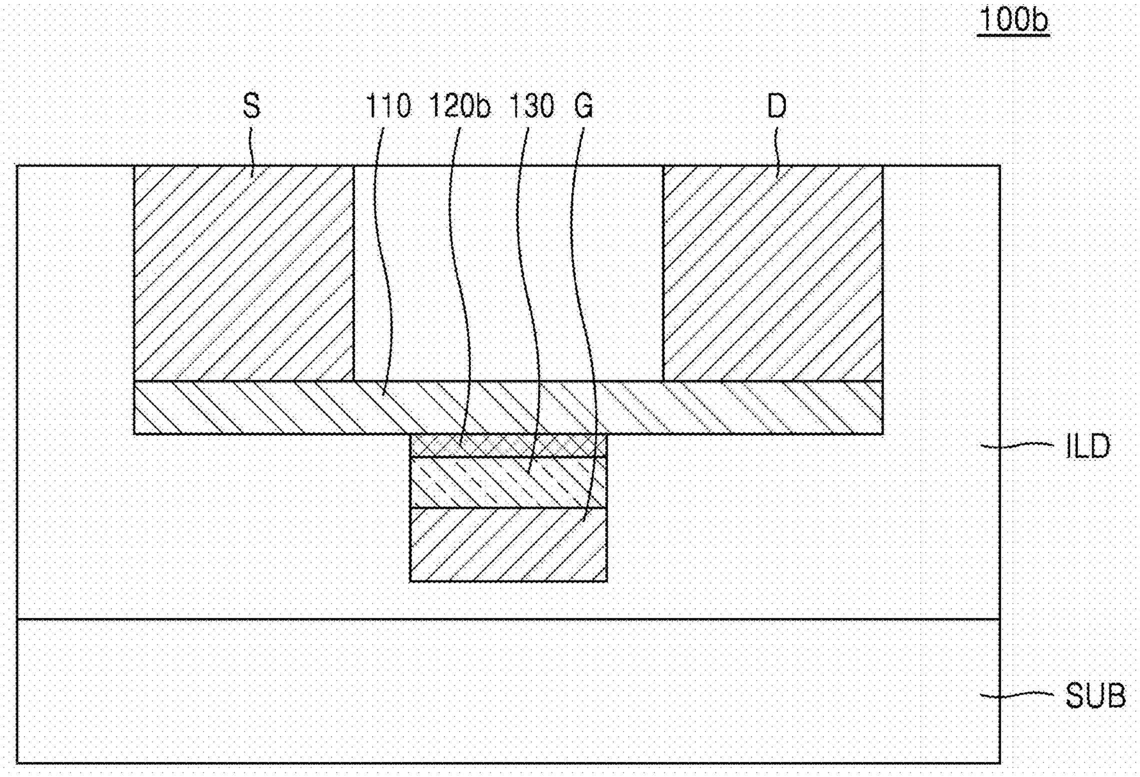
FIG. 12 is a diagram of a semiconductor device having a bottom gate structure, according to at least one embodiment.

FIG. 12 is a diagram of a semiconductor device 100*b* having a bottom gate structure, according to at least one embodiment. Comparing FIGS. 10 and 12, in the semiconductor device 100*b* of FIG. 12, a source electrode S and a drain electrode D may be spaced apart on the upper surface of a channel layer 110, and a gate electrode G may be arranged on the lower surface of the channel layer 110. A gate dielectric layer 130 may be between the channel layer 110 and the gate electrode G.

A self-assembled monolayer 120*b* may be between the channel layer 110 and the gate insulating layer 130. A width of the self-assembled monolayer 120*b* may be greater than or equal to a width of the gate dielectric layer 130. The entire gate dielectric layer 130 may overlap the self-assembled monolayer 120*b* in a thickness direction of the channel layer 110.

Figure 13:
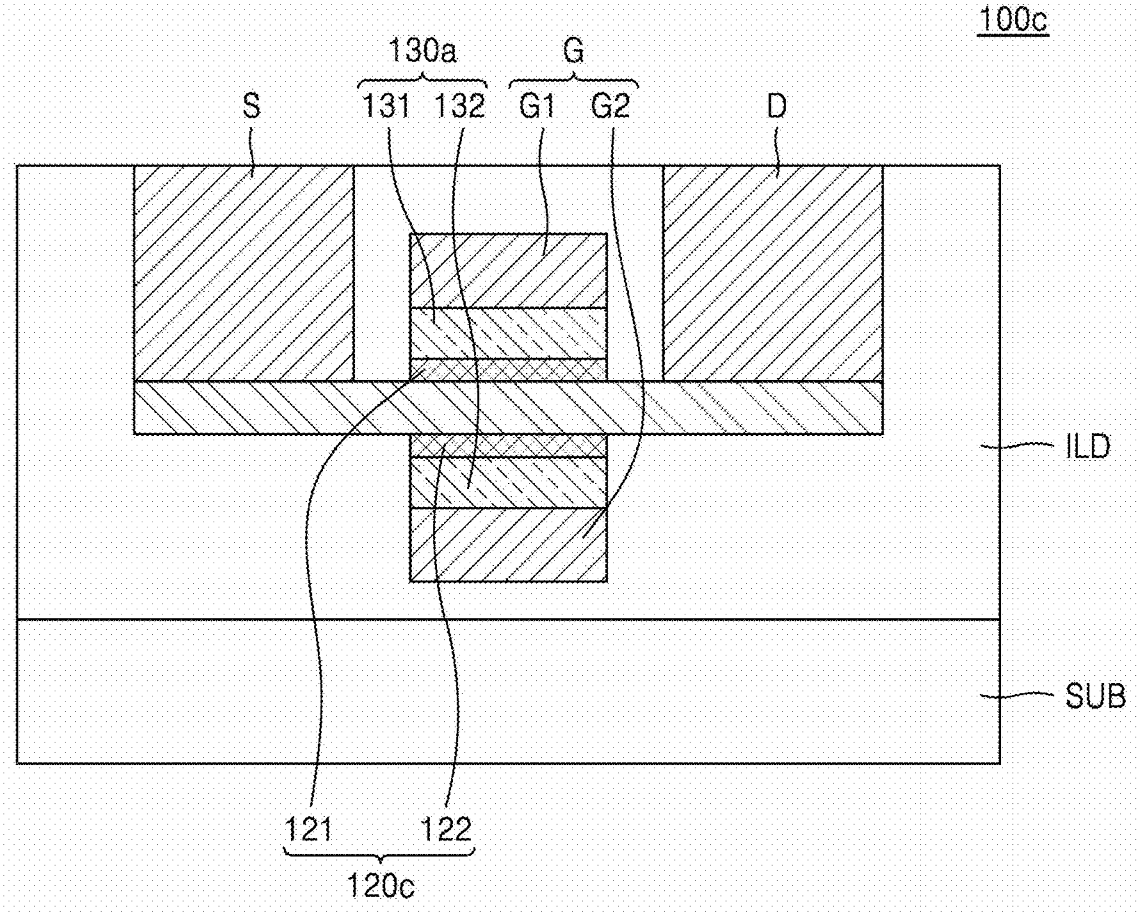
FIG. 13 is a diagram of a semiconductor device having a double gate structure, according to at least one embodiment.

FIG. 13 is a diagram of a semiconductor device 100*c* having a double gate structure, according to at least one embodiment. Comparing FIGS. 10 and 13, a gate dielectric layer 130*a* may include a first gate dielectric layer 131 arranged on the upper surface of the channel layer 110, and a second gate dielectric layer 132 arranged on the lower surface of the channel layer 110. A gate electrode Ga may include a first gate electrode G1 arranged on the upper surface of the first gate dielectric layer 131, and a second gate electrode G2 arranged on the lower surface of the second gate dielectric layer 132.

Self-assembled monolayers 120*c* may be arranged on the surface of the channel layer 110. The self-assembled monolayers 120*c* may include a first self-assembled monolayer 121 arranged on the upper surface of the channel layer 110, and a second self-assembled monolayer 122 arranged on the lower surface of the channel layer 110. The first self-assembled monolayer 121 may be between the channel layer 110 and the first gate dielectric layer 131, and the second self-assembled monolayer 122 may be between the channel layer 110 and the second gate dielectric layer 132. The first self-assembled monolayer 121 may be arranged not only under the first gate dielectric layer 131 but also under the source electrode S and the drain electrode D.

Figure 14:
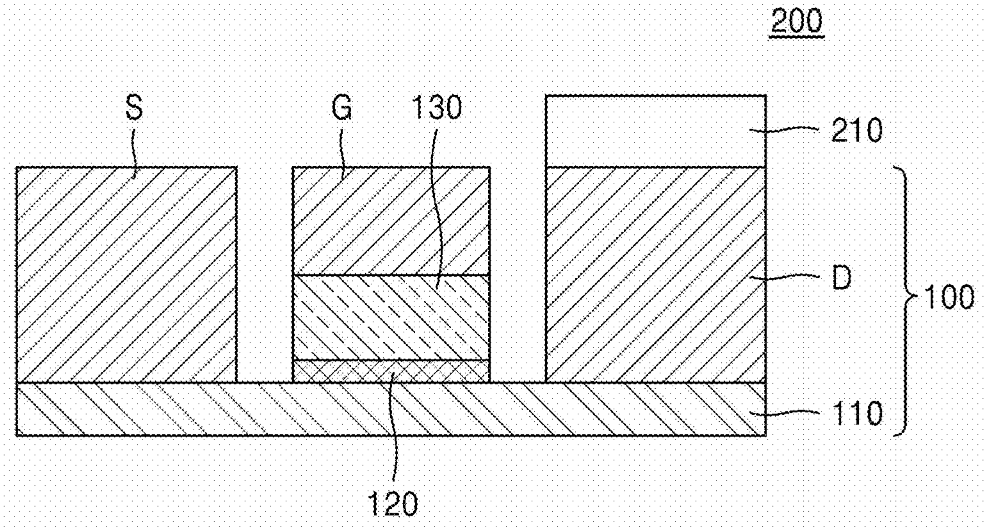
FIG. 14 is a diagram of a memory device using a semiconductor device as a switching device, according to at least one embodiment.

FIG. 14 is a diagram of a memory device that uses the semiconductor device 100 described above as a switching device and includes a data storage element connected to the switching device.

Referring to FIG. 14, a memory device 200 includes a data storage element 210 on an interlayer insulating layer ILD. The data storage element 210 may cover the entire upper surface of the data storage element 210 and may be in direct contact with the upper surface of the data storage element 210. The data storage element 210 may include a capacitor, a ferroelectric capacitor, a magnetic tunnel junction (MTJ) cell, or the like. Depending on the data storage element 210, the memory device 200 may be a volatile memory device such as dynamic random access memory (DRAM) or may be a nonvolatile memory device such as ferroelectric RAM (FRAM), magnetic RAM (MRAM), or resistive RAM (ReRAM).

Figure 15:
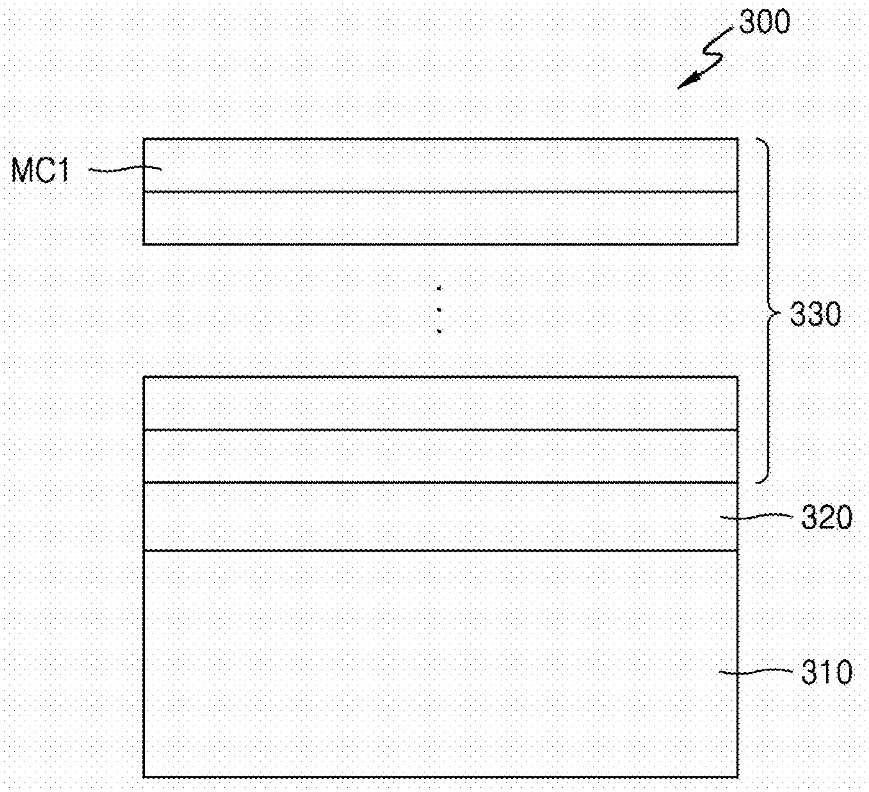
FIG. 15 is a diagram of a memory apparatus in which a plurality of memory devices of FIG. 14 are vertically stacked.

FIG. 15 is a diagram of a memory apparatus in which a plurality of memory cells MC1 of FIG. 14 are vertically stacked.

Referring to FIG. 15, a memory logic layer 320 that controls the operation of a memory apparatus 400 exists on a substrate 310, and a memory cell array 330 is provided on the memory logic layer 320. The memory cell array 330 includes a plurality of memory cells MC1 that are vertically stacked. As an example, the memory cell MC1 may be the memory device 200 of FIG. 10.

Figure 16:
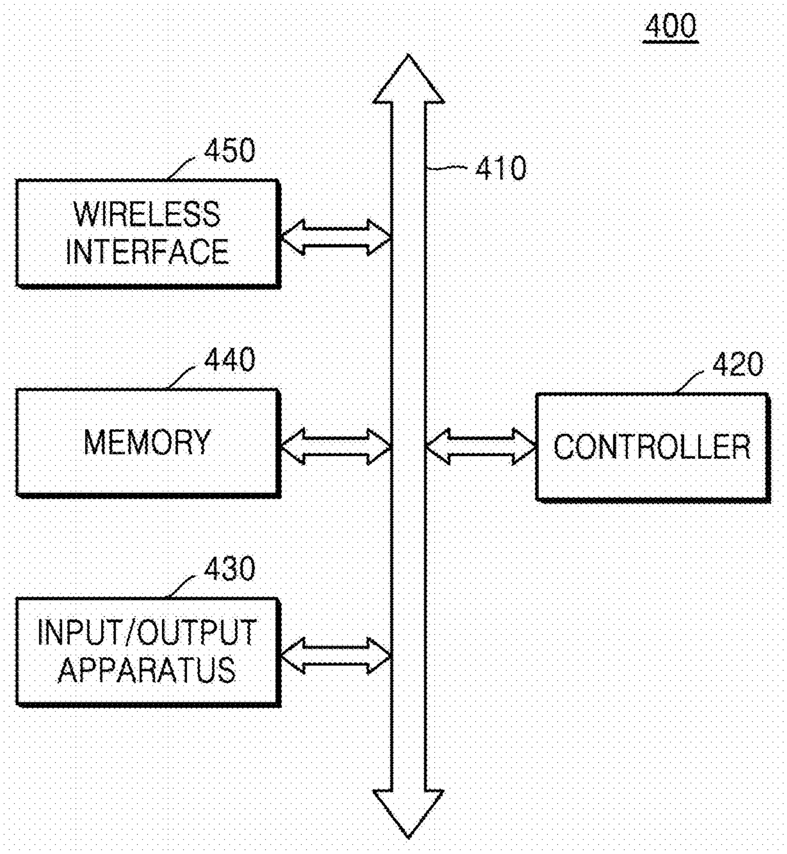
FIG. 16 is a schematic block diagram of an electronic apparatus including a memory apparatus, according to at least one embodiment.

FIG. 16 is a schematic block diagram of an electronic apparatus including a memory apparatus, according to at least one embodiment.

Referring to FIG. 16, an electronic apparatus 400 according to at least one embodiment may be, for example, one of a personal digital assistance (PDA), a laptop computer, a portable computer, a web tablet, a wireless phone, a mobile phone, a digital music player, a wired/wireless electronic apparatus, a composite electronic apparatus including at least two thereof, or the like. The electronic apparatus 400 may include a controller 420, an input/output apparatus 430 (such as a keypad, a keyboard, a display, and/or the like), a memory apparatus 440, and a wireless interface 450, which are coupled to each other through a bus (410).

The controller 420 may include, for example, one or more microprocessors, digital signal processors, microcontrollers, or similar apparatuses. The memory apparatus 440 may be configured to store, for example, instructions executed by the controller 420.

The memory apparatus 440 may be used to store user data. The memory apparatus 440 may include a two-dimensional material layer 11 according to at least one embodiment, a metal island, and a metal layer.

The electronic apparatus 400 may use the wireless interface 450 to transmit data to and/or receive data from a wireless communication network that communicates using wireless signals (e.g., radio frequency (RF) signals). For example, the wireless interface 450 may include an antenna, a wireless transceiver, or the like. The electronic apparatus 400 may be used in communication interface protocols such as third-generation communication systems such as code-division multiple access (CDMA), global system for mobile communication (GSM), North America digital cellular (NADC), electronic time-division multiple access (E-TDMA), wideband CDMA (WCDMA), CDMA2000, or the like.

Figure 17:
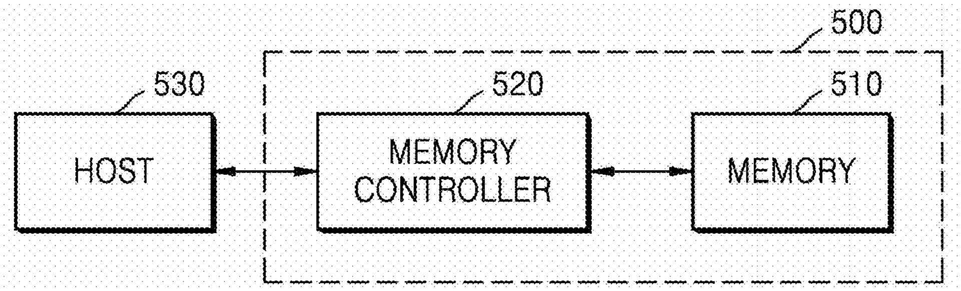
FIG. 17 is a schematic block diagram of a memory system including a volatile memory apparatus, according to at least one embodiment.

FIG. 17 is a schematic block diagram of a memory system including a volatile memory apparatus 500, according to at least one embodiment.

Referring to FIG. 17, the semiconductor device 100 according to at least one embodiment may be used to realize a memory system. The memory system 500 may include a memory 510 for storing large amounts of data and a memory controller 520. The memory controller 520 is configured to control the memory 510 to read and/or write data stored in the memory 510 in response to a read/write request from a host 530. The memory controller 520 may configure an address mapping table to map an address provided from the host 530, such as a mobile apparatus or computer system, to a physical address of the memory 510. The memory 510 may include a two-dimensional material layer 11, a self-assembled monolayer 12, and an oxide layer 13 according to at least one embodiment.

The memory apparatus according to some embodiments described so far may be implemented in a chip form and used, e.g., as a neuromorphic computing platform.

Figure 18:
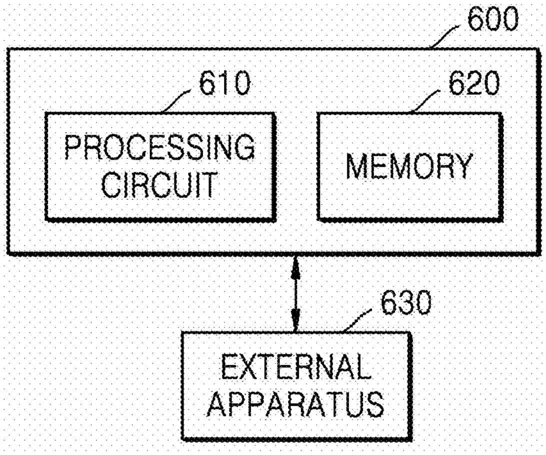
FIG. 18 is a schematic diagram of a neuromorphic apparatus including a memory apparatus, according to at least one embodiment.

FIG. 18 is a schematic diagram of a neuromorphic apparatus including a memory apparatus, according to at least one embodiment. Referring to FIG. 18, a neuromorphic apparatus 600 may include a processing circuit 610 and a memory 620.

The processing circuit 610 may be configured to control functions for driving the neuromorphic apparatus 600. For example, the processing circuit 610 may control the neuromorphic apparatus 600 by executing a program stored in the memory 620 of the neuromorphic apparatus 600. The memory 620 may include a two-dimensional material layer 11, a self-assembled monolayer 12, and an oxide layer 13 according to at least one embodiment.

The processing circuit 610 may include hardware such as a logic circuit, a combination of hardware and software such as a processor executing software, or a combination thereof. For example, the processor may include a central processing circuit (CPU), a graphics processing unit (GPU), an application processor (AP) in the neuromorphic apparatus 600, an arithmetic logic unit (ALU), a digital processor, a microcomputer, a field programmable gate array (FPGA), a system-on-chip (SoC), a programmable logic unit, a microprocessor, an application-specific integrated circuit (ASIC), or the like.

Also, the processing circuit 610 is configured to read and write various types of data from and to an external apparatus 630 and execute the neuromorphic apparatus 600 by using the data. The external apparatus 630 may include a sensor array including an external memory apparatus and/or image sensor (e.g., a complementary metal-oxide semiconductor (CMOS) image sensor circuit).

The neuromorphic apparatus 600 shown in FIG. 18 may be applied to a machine learning system. The machine learning system may utilize, for example, various artificial neural network organizations and processing models, including a convolutional neural network (CNN), a deconvolutional neural network, a recurrent neural network (RNN) selectively including a long short-term memory (LSTM) and/or a gated recurrent unit, a stacked neural network (SNN), a state-space dynamic neural network (SSDNN), a deep belief network (DBN), generative adversarial networks (GANs), and/or restricted Boltzmann machines (RBMs).

The machine learning system may include, for example, linear regression and/or logistic regression, statistical clustering, Bayesian classification, decision trees, dimensionality reduction such as principal component analysis, other types of machine learning models such as expert systems, and/or combinations thereof including ensemble techniques such as random forests. The machine learning models may be used to provide various services, such as image classification service, user authentication service based on biometric information or biometric data, an advanced driver assistance system (ADAS), voice assistant service, automatic speech recognition (ASR) service, or the like, and may be installed on and executed on other electronic apparatuses.

The aforementioned thin-film structure and apparatus including the same have been described with reference to the embodiments shown in the drawings, but these are merely examples, and it should be understood that various modifications and other equivalent embodiments may be made by those of ordinary skill in the art. Although many details are described in the above description, they should be construed as examples of specific embodiments rather than limiting the scope of the disclosure. Therefore, the scope of the disclosure should not be determined by the described embodiments, but rather by the technical idea stated in the claims.

According to at least one embodiment, the uniformity of an oxide layer may be improved by forming a self-assembled monolayer on the surface of a two-dimensional material layer having semiconductor properties and then forming the oxide layer thereon.

According to at least one embodiment, electrical properties of the oxide layer may be improved by forming the self-assembled monolayer on the surface of the two-dimensional material layer including semiconductor properties and then forming the oxide layer thereon.

It should be understood that the embodiments described herein should be considered in a descriptive sense only and not for purposes of limitation. Descriptions of features or aspects within each of the embodiments should typically be considered as available for other similar features or aspects in other embodiments. While one or more embodiments have been described with reference to the figures, it will be understood by one of ordinary skill in the art that various changes in form and details may be made therein without departing from the spirit and scope as defined by the following claims.

What is claimed is:

1. A semiconductor device comprising:

a channel layer including a two-dimensional material layer;

a source electrode and a drain electrode spaced apart from each other on the channel layer;

a gate electrode on the channel layer;

a gate dielectric layer between the channel layer and the gate electrode; and a self-assembled monolayer between the channel layer and the gate dielectric layer, the self-assembled monolayer including self-assembled molecules packed side-by-side, wherein each of the self-assembled molecules includes an end group with an oxygen covalently bonded with a non-metal included in the two-dimensional material layer.

2. The semiconductor device of claim 1, wherein the end group includes at least one of an alkoxy, a halide, an alkyl group, and an alkenyl group.

3. The semiconductor device of claim 1, wherein each of the self-assembled molecules includes a head group covalently bonded with the gate dielectric layer.

4. The semiconductor device of claim 1, wherein each of the self-assembled molecules includes a head group with a non-metal bonded with oxygen included in the gate dielectric layer.

5. The semiconductor device of claim 1, wherein each of the self-assembled molecules includes a head group, the head group including a polar species.

6. The semiconductor device of claim 1, wherein each of the self-assembled molecules includes a head group, the head group including at least one of a thiol group (—SH), an amino group (—$NH_2$), and a hydroxyl group (—OH).

7. The semiconductor device of claim 1, wherein an interfacial energy of the self-assembled monolayer is higher than an interfacial energy of the two-dimensional material layer.

8. The semiconductor device of claim 1, wherein a water contact angle of the self-assembled monolayer is less than a water contact angle of the two-dimensional material layer.

9. The semiconductor device of claim 1, wherein a water contact angle of the self-assembled monolayer is less than or equal to 75 degrees.

10. The semiconductor device of claim 1, wherein a thickness of the gate dielectric layer is greater than or equal to a thickness of the self-assembled monolayer.

11. The semiconductor device of claim 1, wherein a thickness of the gate dielectric layer is at least about 1 nm and about 20 nm or less.

12. The semiconductor device of claim 1, wherein the gate dielectric layer is non-porous.

13. The semiconductor device of claim 1, wherein an equivalent oxide thickness (EOT) of the gate dielectric layer is greater than or equal to 0.9 nm.

14. The semiconductor device of claim 1, wherein the gate dielectric layer includes at least one of hafnium (Hf), silicon (Si), aluminum (Al), zirconium (Zr), yttrium (Y), lanthanum (La), gadolinium (Gd), and strontium (Sr).

15. The semiconductor device of claim 1, wherein the two-dimensional material layer includes a transition metal chalcogenide (TMC).

16. The semiconductor device of claim 15, wherein the TMC includes at least one of molybdenum (Mo), tungsten (W), niobium (Nb), vanadium (V), tantalum (Ta), titanium (Ti), zirconium (Zr), hafnium (Hf), technetium (Tc), and rhenium (Re), and a chalcogen element selected from sulfur (S), selenium (Se), and tellurium (Te).

17. The semiconductor device of claim 1, wherein at least one of the source electrode and the drain electrode includes an oxide having conductive properties.

18. The semiconductor device of claim 17, wherein the self-assembled monolayer is further included between the two-dimensional material layer and at least one of the source electrode and the drain electrode.

* * * * *